(12) United States Patent
Murano

(10) Patent No.: US 7,759,025 B2
(45) Date of Patent: Jul. 20, 2010

(54) HALF-TONE TYPE PHASE-SHIFTING MASK AND METHOD FOR MANUFACTURING THE SAME

(75) Inventor: Koji Murano, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 629 days.

(21) Appl. No.: 11/783,036

(22) Filed: Apr. 5, 2007

(65) Prior Publication Data

US 2007/0238032 A1    Oct. 11, 2007

(30) Foreign Application Priority Data

Apr. 7, 2006    (JP)    .............................. 2006-106550

(51) Int. Cl.
*G03F 1/00*    (2006.01)
*G03C 5/00*    (2006.01)

(52) U.S. Cl. .......................................... 430/5; 430/394
(58) Field of Classification Search ...................... 430/5, 430/394, 311
See application file for complete search history.

(56) References Cited

U.S. PATENT DOCUMENTS

| | | | |
|---|---|---|---|
| 5,614,335 A | | 3/1997 | Hashimoto et al. |
| 5,789,116 A | * | 8/1998 | Kim ............................... 430/5 |
| 7,393,613 B2 | * | 7/2008 | Dettmann et al. .............. 430/5 |

| | | |
|---|---|---|
| 2005/0139575 A1 | 6/2005 | Lee |

FOREIGN PATENT DOCUMENTS

| | | |
|---|---|---|
| JP | 06-118614 | 4/1994 |
| JP | 2002-278040 | 9/2002 |

OTHER PUBLICATIONS

Sato et al, "Hp45 Lithography in Consideration of the Mask 3D Effect", Proc. of SPIE, vol. 6283, pp. 62831F-1 through 62831F-9, (2006).
Sato et al, "Impact of Polarization for an Attenuated Phase Shift Mask with ArF Hyper-NA Lithography", Proc. of SPIE, vol. 5754, pp. 1063-1069, (2005).

* cited by examiner

*Primary Examiner*—Stephen Rosasco
(74) *Attorney, Agent, or Firm*—Finnegan, Henderson, Farabow, Garrett & Dunner, L.L.P.

(57) ABSTRACT

A half-tone type phase-shifting mask is disclosed. The mask includes a half-tone film disposed on a part on which a light-shielding pattern and a part on which a semi-light shielding pattern, and a light-shielding film disposed on the half-tone film residing in a part on which the light-shielding pattern. The semi-light shielding pattern includes a first semi-light shielding pattern and a second semi-light shielding pattern having a smaller dimension than that of the first semi-light shielding pattern. In the half-tone film, a region on which the light-shielding pattern is formed and a region of the second semi-light shielding pattern have a first light transmittance, while a region of the first semi-light shielding pattern has a second light transmittance different from the first light transmittance.

19 Claims, 7 Drawing Sheets

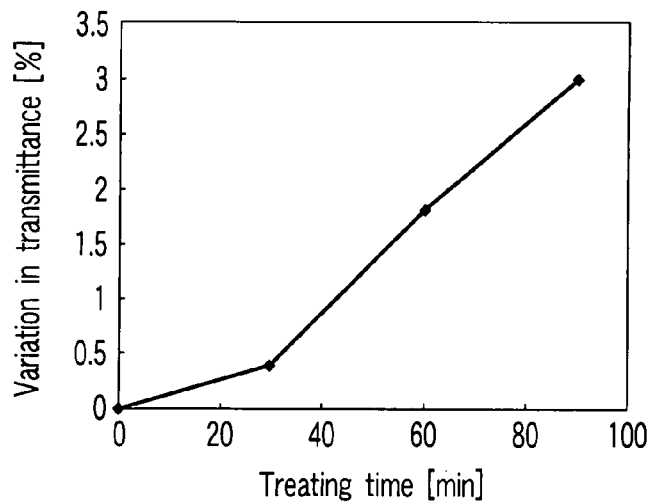
F I G. 12
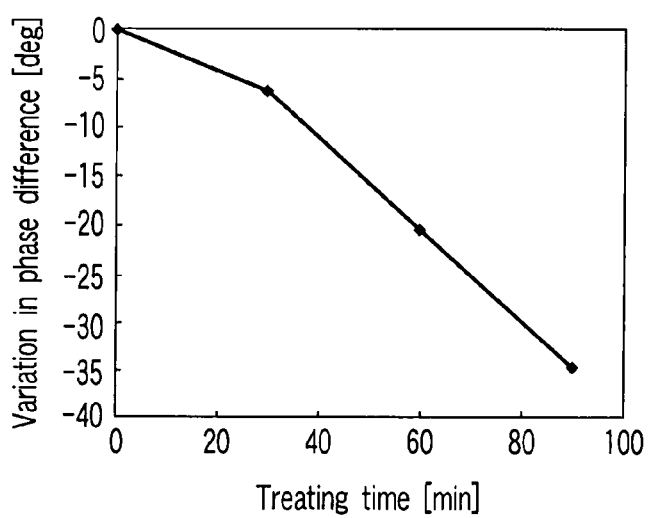
F I G. 13
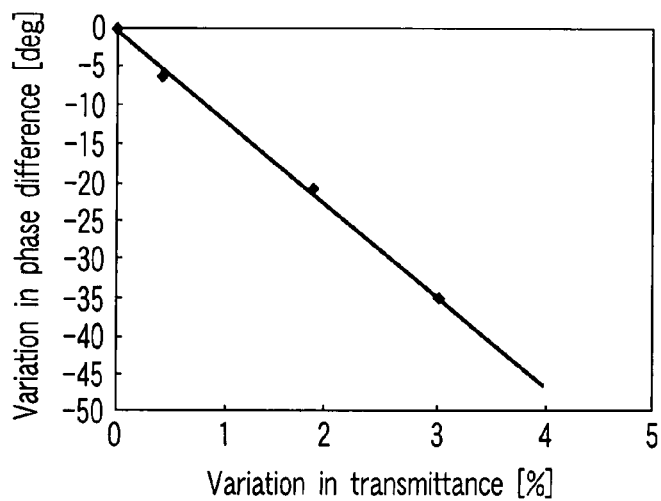
F I G. 14

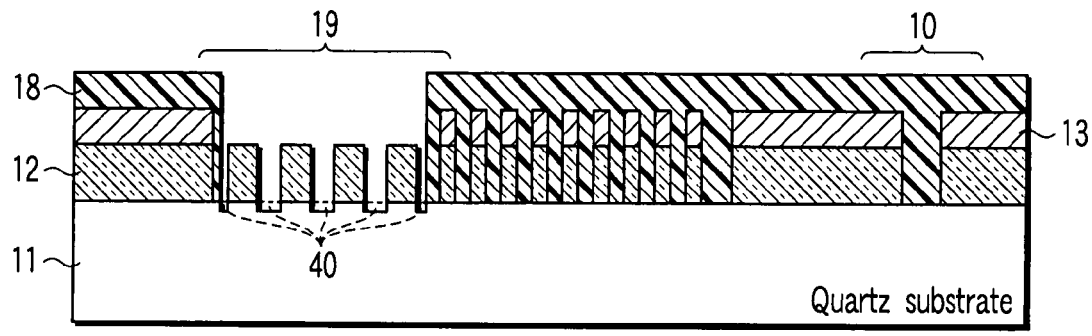
F I G. 15
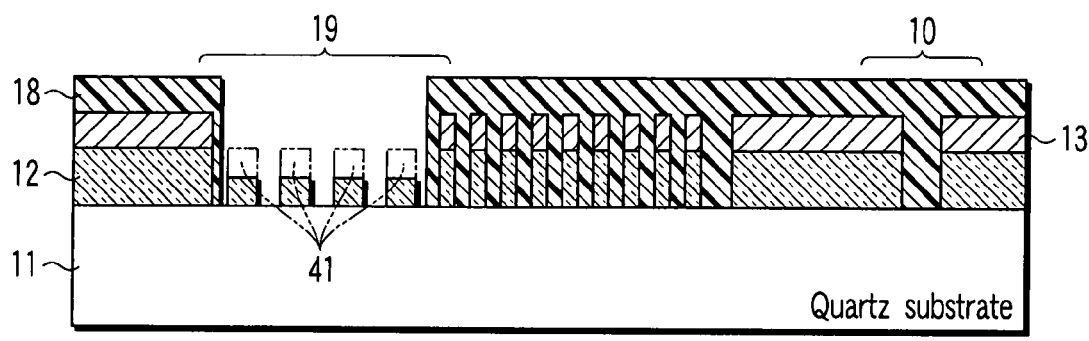
F I G. 16

HALF-TONE TYPE PHASE-SHIFTING MASK AND METHOD FOR MANUFACTURING THE SAME

CROSS-REFERENCE TO RELATED APPLICATIONS

This application is based upon and claims the benefit of priority from prior Japanese Patent Application No. 2006-106550, filed Apr. 7, 2006, the entire contents of which are incorporated herein by reference.

BACKGROUND OF THE INVENTION

1. Field of the Invention

The present invention relates to a photomask and a method for manufacturing the same, and particularly to a half-tone type phase-shifting mask and a method for manufacturing the same.

2. Description of the Related Art

In recent years, problems in the photolithographic step applied in a process for manufacturing semiconductors are becoming increasingly marked. With the progress of fineness in a semiconductor device, demands for the fineness in the photolithographic step are increasing. In this respect, such fineness has already progressed up to halfpitch (hp)=45 nm in the design rule of a leading-edge device. Hence, exposure achieved by combining liquid immersion exposure with polarization illumination has managed to realize the fineness. In these circumstances, light transmittance 6% in a half-tone mask which has been heretofore considered optimum is no longer optimum in a fine pattern of hp=50 nm or less. In this connection, there is described that a lower light transmittance of 2% or less is the most appropriate in a pattern of hp=45 nm in T. Sato, et al., "Impact of polarization for an attenuated phase shift mask with ArF hyper-NA lithography" Proceedings of SPIE, vol. 5754, pp 1063-1069.

This is because intensity balance between zero-order diffracted light and primary diffracted light of the diffracted light passed through the mask is affected by the space structure of the mask to disrupt the balance. It is caused by the fact that the intensity of zero-order diffracted light weakens relatively with decrease in the dimension of the mask. More specifically, a half-tone type phase-shifting mask becomes the most effective at the point at which intensities of the zero-order diffracted light and the primary diffracted light come to be substantially equal to each other. The transmittance at which the intensity ratio of the zero-order diffracted light and the primary diffracted light comes to be optimum becomes lower with reduction in the size in a fine pattern.

However, also in a photomask for manufacturing a semiconductor integrated circuit device having an integrated circuit pattern of hp=45 nm (called "device pattern" in the present specification), there are a pattern region of hp=45 nm and also pattern regions of more than hp=45 nm. This suggests that there arise circumstances in which the optimum light transmittance of a half-tone pattern differs depending on a dimension of the device pattern in a photomask surface.

Incidentally, since the light transmittance of the opening differs depending on the dimension of the opening (phenomenon that the smaller opening brings about usually the smaller light transmittance in a dimension being substantially the same as that of the wavelength is well-known) in a Levenson type phase-shifting mask, a method for lowering the light transmittance in a region in which the opening is large in conformity to a fine pattern where the light transmittance becomes the smallest is disclosed in Jpn. Pat. Appln. KOKAI Publication No. 6-118614.

BRIEF SUMMARY OF THE INVENTION

A half-tone type phase-shifting mask according to a first aspect of the present invention comprises: a transparent substrate; a half-tone film provided on a part on which the light-shielding pattern is to be formed and a part on which the semi-light shielding pattern is to be formed in the transparent substrate, wherein the semi-light shielding pattern includes a first semi-light shielding pattern composed of the half-tone film and a second semi-light shielding pattern composed of the half-tone film and having a smaller dimension than that of the first semi-light shielding pattern, and a part on which the light-shielding pattern is to be formed and a part of the second semi-light shielding pattern have a first light transmittance, while a part of the first semi-light shielding pattern has a second light transmittance different from the first light transmittance within the half-tone film; and a light-shielding film provided on the half-tone film residing in a part on which the light-shielding pattern is to be formed within the half-tone film.

A manufacturing method of a half-tone type phase-shifting mask according to a second aspect of the present invention comprises: preparing mask blanks provided with at least a half-tone film and a light-shielding film laminated on a transparent substrate; forming a light-shielding pattern composed of the laminate of the half-tone film and the light-shielding film, and a semi-light shielding pattern including a first semi-light shielding pattern composed of the half-tone film, and a second semi-light shielding pattern composed of the half-tone film and having a smaller dimension than that of the first semi-light shielding pattern on the mask blanks; and selectively changing a light transmittance of a part of the first semi-light shielding pattern to that of a part on which the light-shielding pattern is to be formed and a part of the second semi-light shielding pattern within the half-tone film.

A manufacturing method of a half-tone type phase-shifting mask according to a third aspect of the present invention comprises: preparing mask blanks obtained by laminating a half-tone film, a light-shielding film, and a first resist film on a transparent substrate; drawing a device pattern including a first device pattern and a second device pattern having a smaller dimension than that of the first device pattern, and a first opening pattern defining an alignment mark on the first resist film; developing the first resist film to obtain a first resist pattern having the device pattern and the first opening pattern; using the first resist pattern as an etching mask to etch the light-shielding film and the half-tone film, thereby forming the device pattern and an alignment mark corresponding to the first opening pattern on the light-shielding film and the half-tone film; removing the first resist pattern to form a second resist film on the transparent substrate and the light-shielding film; drawing a second opening pattern corresponding to a part of the first device pattern on the second resist film while positioning with the use of the alignment mark formed on the light-shielding film as a reference; developing the second resist film to obtain a second resist pattern having the second opening pattern; using the second resist film as an etching mask to etch the light-shielding film, thereby exposing the half-tone film residing in a part of the first device pattern; removing the second resist pattern; using the light-shielding film as a mask to apply at least one of a light irradiation treatment, a substrate heating treatment, a plasma treatment, and a chemical solution treatment to the exposed part of the half-tone film, thereby selectively changing a light transmittance in the exposed part of the half-tone film; forming a third resist film on the transparent substrate, the light-shielding film, and the half-tone film; drawing a third opening pattern, corresponding to the part of the device pattern including the first and second device patterns, on the third resist film while positioning with the use of the alignment mark formed on the light-shielding film as a reference; using the third resist film as an etching mask to etch the light-shielding film, thereby exposing the half-tone film residing in the part of the device pattern; and removing the third resist pattern.

A manufacturing method of a semiconductor device according to a fourth aspect of the present invention comprises: transcribing circuit patterns on a half-tone type phase-shifting mask to a semiconductor substrate, the half-tone type phase-shifting mask including: a transparent substrate; a half-tone film provided on a part on which the light-shielding pattern is to be formed and a part on which the semi-light shielding pattern is to be formed in the transparent substrate, wherein the semi-light shielding pattern includes a first semi-light shielding pattern composed of the half-tone film and a second semi-light shielding pattern composed of the half-tone film and having a smaller dimension than that of the first semi-light shielding pattern, and a part on which the light-shielding pattern is to be formed and a part of the second semi-light shielding pattern have a first light transmittance, while a part of the first semi-light shielding pattern has a second light transmittance different from the first light transmittance within the half-tone film; and a light-shielding film provided on the half-tone film residing in a part on which the light-shielding pattern is to be formed within the half-tone film.

BRIEF DESCRIPTION OF THE SEVERAL VIEWS OF THE DRAWING

FIG. 12 is a graphical representation illustrating a relationship between a time for rinsing treatment with a warmed pure water of 80° C. and a variation in transmittance of a half-tone film;

FIG. 13 is a graphical representation illustrating a relationship between a time for rinsing treatment with a warmed pure water of 80° C. and a variation in phase differences;

FIG. 14 is a graphical representation illustrating a relationship between a variation in transmittance of a half-tone film and a variation in phase differences;

FIG. 15 is a sectional view showing steps for adjusting phase differences in the case where the phase differences become smaller;

FIG. 16 is a sectional view showing steps for adjusting phase differences in the case where the phase differences become larger;

DETAILED DESCRIPTION OF THE INVENTION

Figure 1:
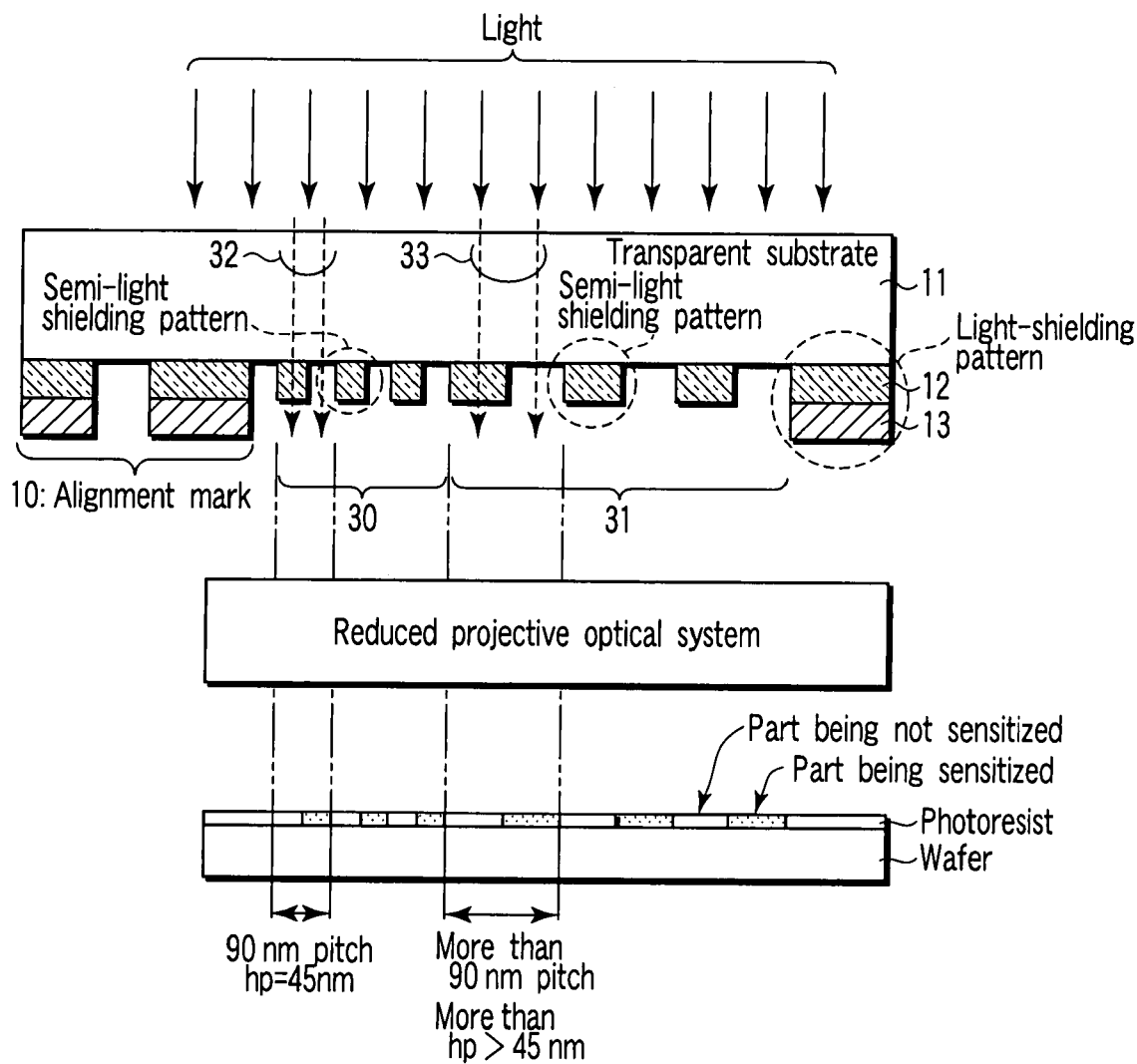
FIG. 1 is a diagram showing a half-tone type phase-shifting mask according to a first embodiment of the present invention.

Embodiments of the present invention have been made in view of the circumstance different from that of a conventional Levenson type phase-shifting mask. In this respect, the embodiments of the invention is to provide a manner for changing the light transmittance of a half-tone film in response to the dimension of a pattern for the purpose of uniformizing the intensity of zero-order diffracted light and that of primary diffracted light in the half-tone type phase-shifting mask as mentioned above.

The essence of the embodiments of the present invention resides basically in that a mask pattern (an example thereof is a resist pattern) including, as an opening, a region in which the transmittance is desired to be raised (in other words, a large pattern is finally formed) is formed on half-tone mask blanks having a light transmittance of, for example, around 2%, the resulting mask pattern is used for a mask to etch a light shielding film thereby exposing the half-tone film, and a treatment for adjusting light transmittance is applied to the exposed half-tone film, whereby the light transmittance of the half-tone film in the mask surface is raised partially to around 6%.

Thereafter, when a fresh mask pattern (an example thereof is a resist pattern) is formed, and a half-tone pattern is formed in accordance with a usual process for forming a photomask, so that it becomes possible that a fine pattern region in which a low light transmittance is optimum has such low light transmittance, while a large pattern region in which a high light transmittance is optimum has such high light transmittance.

When the half-tone type phase-shifting mask as described above is used, it becomes possible to manufacture a semiconductor integrated circuit device including an ultrafine circuit pattern of, for example, hp=45 nm or less and a circuit pattern of more than hp=45 nm at a high yield.

Furthermore, any of the processes for adjusting light transmittance as described hereinbelow is applicable to usual mask processing devices, whereby it becomes possible to simply manufacture the above-described half-tone type phase-shifting mask.

Moreover, a light-shielding belt section is provided on a photomask in order to suppress the leaking light at the time of exposing a wafer. The light-shielding belt section is composed of a laminate structure including a half-tone film and a light-shielding film, and particularly, a film thickness of the light-shielding film is determined to be a thickness for cutting off exposure wavelength. In the embodiment of the present invention, since a half-tone film having a lower light transmittance than that of a conventional film is used, a thickness of the light-shielding film can be thinner than that of the conventional film. As a result of the thinned light-shielding film, the processing accuracy of a mask pattern is also improved. In addition, as a result of improvement in the processing accuracy of a mask pattern and the optimization of the light transmittance in response to the dimension of a half-tone pattern, particularly, a part of an ultrafine circuit pattern of, for example, hp=45 nm or less can be reproduced on a wafer at a higher probability, whereby a yield of a semiconductor integrated circuit device involving an ultrafine circuit pattern of, for example, hp=45 nm or less and a circuit pattern of more than hp=45 nm is further elevated.

In the following, some embodiments of the invention will be described by referring to the accompanying drawings. In the drawings, the same components are designated by the same reference numerals, respectively.

First Embodiment

FIG. 1 is a diagram showing a half-tone type phase-shifting mask according to a first embodiment of the present invention.

As shown in FIG. 1, the half-tone type phase-shifting mask in the embodiment is provided with a transparent substrate 11, a half-tone film 12, and a light-shielding film 13. The half-tone film 12 is provided on an area in which a light-shielding pattern is formed and another area in which a semi-light shielding pattern is formed in the transparent substrate 11. The light-shielding film 13 is provided on an area in which the light-shielding pattern is formed in the half-tone film 12. An example of the light-shielding pattern is a light-shielding belt section provided in a photomask for suppressing a leaking light at the time of exposing a wafer.

The semi-light shielding pattern includes a first semi-light shielding pattern 31 composed of the half-tone film 12, and a second semi-light shielding pattern 30 composed similarly of the half-tone film 12 and having a smaller dimension than that of the first semi-light shielding pattern 31.

In FIG. 1, arrows 32 and 33 designate light-transmitting paths. A light-transmitting path 32 is a light-transmitting path for a region including the second semi-light shielding pattern 30 having the smaller dimension than that of the first semi-light shielding pattern 31. A light-transmitting path 33 is a light-transmitting path for a region including the first semi-light shielding pattern 31.

Light is input from a surface on which no half-tone film 12 or light-shielding film 13 is formed in the transparent substrate 11, and is input to a reduced projection optical system through the transparent substrate (an example thereof is a quartz substrate) 11 as well as the transparent substrate 11 and the half-tone film (an example thereof is a MoSiON compound film) 12. The light output from the reduced projection optical system is irradiated onto a photoresist film formed on a semiconductor substrate (an example thereof is a wafer). In the photoresist film, a part which does not expose to light and a part which does expose to light are obtained on a half-tone type phase-shifting mask in accordance with a device pattern drawn by using a semi-light shielding pattern and a light-shielding pattern. The device pattern means a circuit pattern as mentioned above. For instance, it means a pattern formed in each layer of a semiconductor integrated circuit device, such as a pattern of an element region, a pattern of a wiring, a pattern of contact holes (or a pattern of via holes, or a pattern of wiring grooves) and the like.

The second semi-light shielding pattern 30 is a pattern having a small dimension in the half-tone type phase-shifting mask. An example of a dimension of the second semi-light shielding pattern 30 is the one in which a pattern of hp=45 nm is obtained when the photoresist on a wafer is exposed.

The first semi-light shielding pattern 31 is a pattern having a larger dimension than that of the second light-shielding pattern 30. An example of a dimension of the first semi-light shielding pattern 31 is the one in which a pattern of hp=more than 45 nm is obtained when the photoresist on a wafer is exposed.

It is to be noted that the second semi-light shielding pattern 30 is not limited to a pattern by which the pattern having the smallest dimension is obtained as hp=45 nm, but it may be a pattern by which the pattern having a small dimension is obtained as, for example, hp=50 nm or less. In this case, the first semi-light shielding pattern 31 may be a pattern by which the pattern of hp=more than 50 nm is obtained.

In the first embodiment, a light transmittance of the half-tone film 12 residing in a region including the first semi-light shielding pattern 31 (a large pattern region) is made to be selectively higher than that of the half-tone film 12 residing out of the first semi-light shielding pattern 31. As a result, the first embodiment can provide the optimum light transmittances for the light transmittance of a region including the first semi-light shielding pattern 31 (a large pattern region) and the light transmittance of a region including the second semi-light shielding pattern 30 (a fine pattern region), respectively.

An example of the optimum light transmittance is 4% in the half-tone film 12 residing in a region including the first semi-light shielding pattern 31 (a large pattern region), while 2% in the half-tone film 12 residing in a region including the second semi-light shielding pattern 30 (a fine pattern region), when it is assumed that a light source of an exposure device to be used is an ArF excimer laser (wavelength=193 nm), the half-tone film 12 is a MoSiON compound film having 70 nm thickness, and an image dissection is conducted at hp=45 nm.

Then, one example of a method for manufacturing the half-tone type phase-shifting mask according to the first embodiment will be described.

FIGS. 2 to 10 are sectional views each showing a step for manufacturing the half-tone type phase-shifting mask according to the first embodiment in order.

(Steps for Forming an Opening in a High Transmittance Region)

First, pattern data in a large pattern region which is intended to be made a high transmittance pattern are generated from the pattern data to be formed on a mask.

Figure 2:
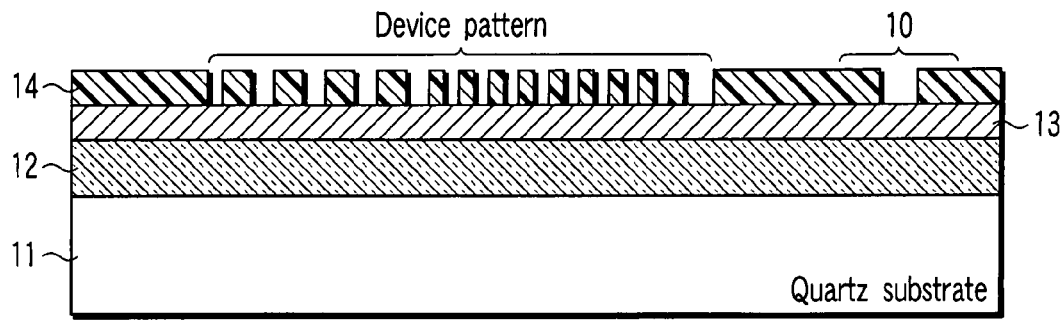
FIG. 2 is a sectional view showing steps for manufacturing the half-tone type phase-shifting mask according to the first embodiment in order.

Next, ArF half-tone (HT) mask blanks are prepared as shown in FIG. 2. The mask blanks of the present example is provided with the transparent substrate 11, the half-tone film 12 having 2% transmittance and formed on the transparent substrate 11, the light-shielding film 13 formed on the half-tone film 12, and an electron beam resist film applied on the light-shielding film 13. An example of the transparent substrate 11 is a quartz substrate. Similarly, an example of the half-tone film 12 is a MoSiON compound. In a similar fashion, an example of the light-shielding film 13 is chromium. A thickness of the light-shielding film 13 may be such that necessary and sufficient light-shielding property can be obtained by a laminate with a half-tone film having 2% transmittance. As a result, it becomes possible to use the laminate which is made to be thinner than a conventional ArF half-tone mask blank having 6% transmittance. An example of thickness of the light-shielding film 13 is 30 nm. Then, an opening pattern for defining an alignment mark 10 and a device pattern are drawn on a resist film by the use of an electron beam mask drawing device (an example thereof is EBM 5000 manufactured by New Flare Technology). Thereafter, the resist film is developed to form a resist pattern 14 having the above-described opening pattern and the device pattern.

Figure 3:
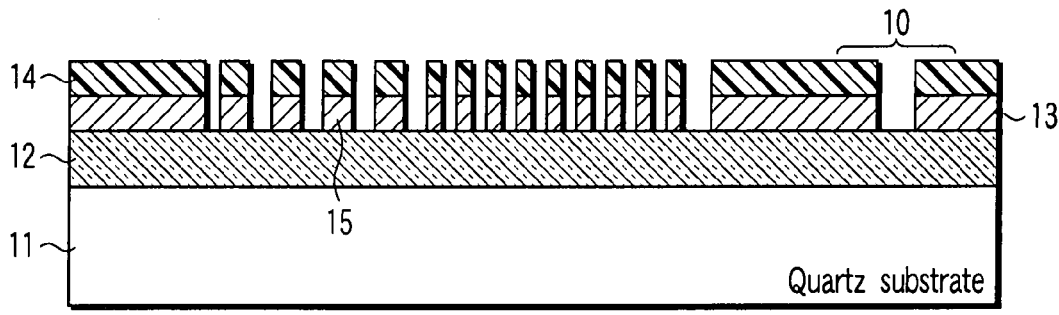
FIG. 3 is a sectional view showing steps for manufacturing the half-tone type phase-shifting mask according to the first embodiment in order.

Next, the resist pattern 14 is used as a mask for etching to etch the light-shielding film 13, for example, by means of a dry-etching treatment as shown in FIG. 3, whereby the device pattern and the alignment mark 10 corresponding to the opening pattern are formed on the light-shielding film 13. The alignment mark 10 is formed on the light-shielding film 13 at the same time with the device pattern. In this case, since the light-shielding film 13 of the present example is made to be thinner than conventional ArF half-tone mask blanks of 6% transmittance, an etching time for the light-shielding film 13 is reduced. In addition, the dimensional accuracy of the light-shielding film 13 is also improved due to the fact that the light-shielding film 13 is thin and the etching time therefor is short.

Figure 4:
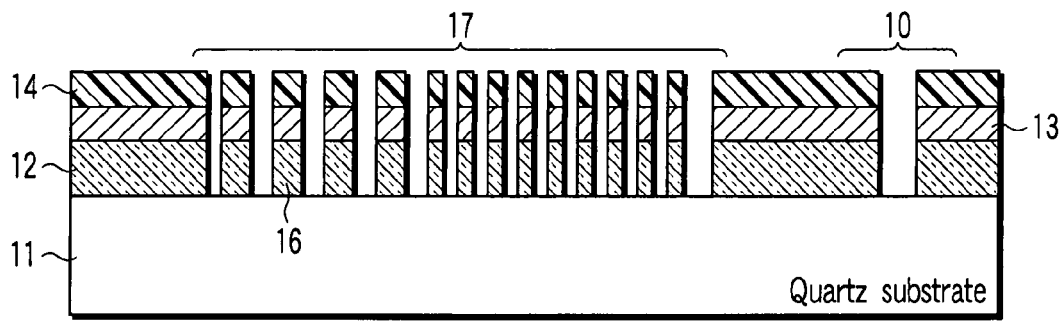
FIG. 4 is a sectional view showing steps for manufacturing the half-tone type phase-shifting mask according to the first embodiment in order.

Then, the resist pattern 14 is used as a mask for etching to etch the half-tone film 12 in succession to the etching of the light-shielding film 13 as shown in FIG. 4. On the half-tone film 12, the above-described device pattern and the alignment mark 10 corresponding to the above-described first opening pattern are formed.

Figure 5:
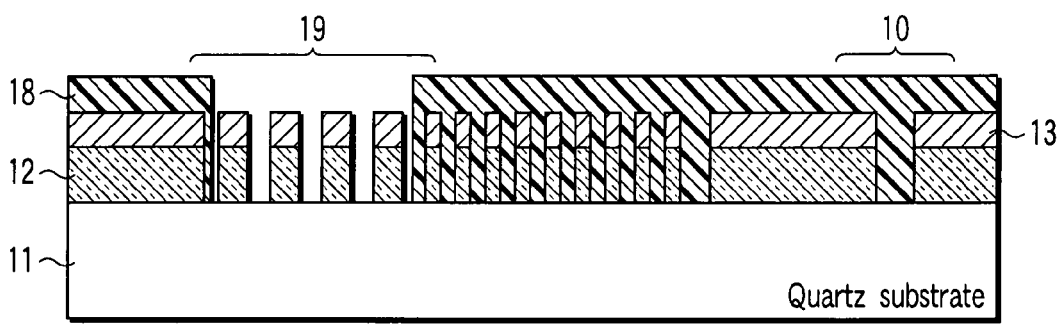
FIG. 5 is a sectional view showing steps for manufacturing the half-tone type phase-shifting mask according to the first embodiment in order.

Thereafter, the resist pattern 14 is removed as shown in FIG. 5. Then, a resist is applied on the transparent substrate 11 and the light-shielding film 13 to form a resist film. Next, an opening pattern 19 is drawn on the resist film while positioning with the alignment mark formed on the light-shielding film 13 as the reference by using the above-described electron beam mask drawing device based on the pattern data on a large pattern region which has been generated previously and intended to have high transmittance. Then, the resist film is developed to form a resist pattern 18 having the opening pattern 19. From the opening pattern 19, a large pattern region which is intended to have a high transmittance is exposed.

Figure 6:
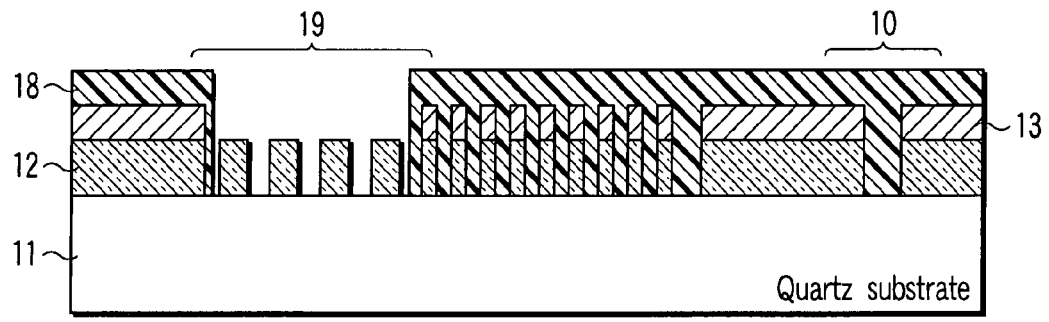
FIG. 6 is a sectional view showing steps for manufacturing the half-tone type phase-shifting mask according to the first embodiment in order.

Next, the resist pattern 18 is used as a mask for etching to etch the light-shielding film 13, whereby the surface of the half-tone film 12 residing in the part of a large pattern region is allowed to expose as shown in FIG. 6.

(Steps for Achieving High Transmittance)

Figure 7:
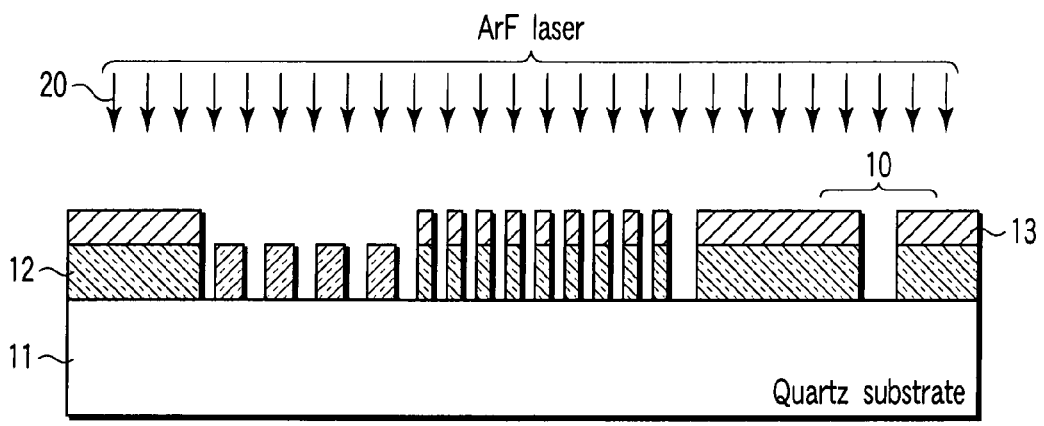
FIG. 7 is a sectional view showing steps for manufacturing the half-tone type phase-shifting mask according to the first embodiment in order.

Next, the resist pattern 18 is removed as shown in FIG. 7. Thereafter, a treatment including at least one of a light irradiation treatment, a substrate heating treatment, a plasma treatment, and a chemical solution treatment is applied to a region of the half-tone film 12 the surface of which is exposed in a large pattern region by using the light-shielding film 13 as a mask, whereby a light transmittance of the part of the half-tone film 12 the surface of which is exposed is allowed to change selectively. In the present example, the half-tone film 12 is irradiated by ArF laser in an irradiation amount of 100 kJ. As a result, a light transmittance of the half-tone film 12 the surface of which is exposed is elevated from 2% to 4%. In order to further elevate the light transmittance, for example, it is necessary to either increase an irradiation amount of ArF laser or irradiate, for example, a $F_2$ laser having a shorter wavelength than that of the ArF laser. As a result, a fine pattern is formed as a pattern of the half-tone film 12 having a low transmittance, while another pattern being not so fine is formed as a pattern of the half-tone film 12 in which the transmittance thereof is elevated by means of the laser irradiation.

(Steps for Forming a Light-Shielding Frame)

Figure 8:
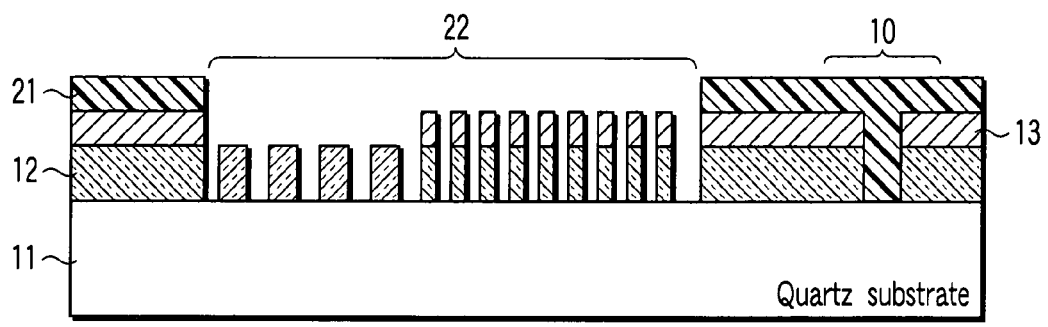
FIG. 8 is a sectional view showing steps for manufacturing the half-tone type phase-shifting mask according to the first embodiment in order.

Next, a resist is applied on the transparent substrate 11, the half-tone film 12, and the light-shielding film 13 to form a resist film as shown in FIG. 8. Then, an opening pattern 22 is drawn, by using the above-described electron beam mask drawing device, on the resist film while positioning with the use of an alignment mark formed on the light-shielding film 13 as the reference based on the pattern data of a device pattern. Then, the resist film is developed to form a resist pattern 21 having the opening pattern 22. The device pattern is exposed from the opening pattern 22. In the present example, the steps for drawing the opening pattern 22 and developing it are steps for drawing the data of a light-shielding belt section pattern (light-shielding frame) to be formed on a mask and developing it.

Figure 9:
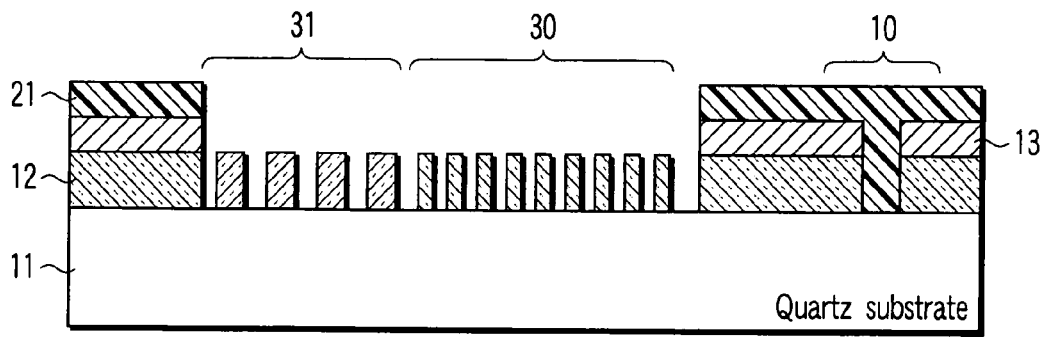
FIG. 9 is a sectional view showing steps for manufacturing the half-tone type phase-shifting mask according to the first embodiment in order.

Thereafter, the light-shielding film 13 is etched by using the resist pattern 21 as a mask for etching, and the half-tone film 12 residing in the region of the device pattern is exposed as shown in FIG. 9.

Figure 10:
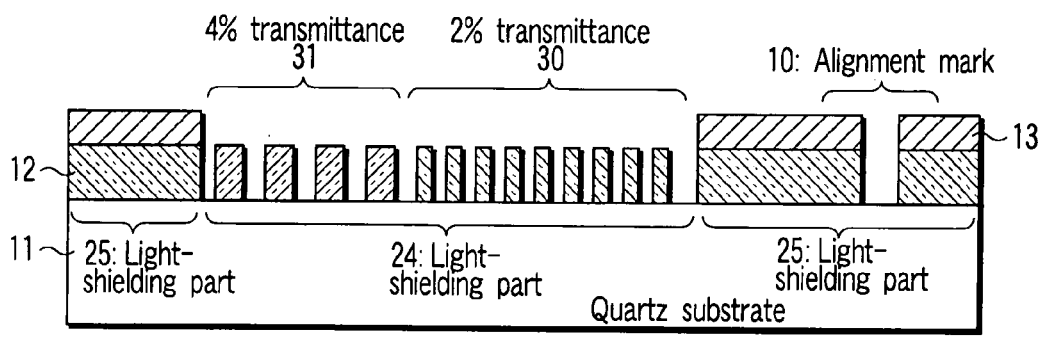
FIG. 10 is a sectional view showing steps for manufacturing the half-tone type phase-shifting mask according to the first embodiment in order.

Then, the resist pattern 21 is removed to complete the half-tone type phase-shifting mask according to the first embodiment as shown in FIG. 10.

The half-tone type phase-shifting mask according to the first embodiment corresponds to the one in which the half-tone film 12 included in the fine pattern region 30 and the half-tone film 12 included in the light-shielding belt section have 2% light transmittance, while the half-tone film 12 included in a region 31 of not so fine pattern has 4% light transmittance. Accordingly, a tolerance of lithography is elevated in comparison with a case where the light transmittance in the half-tone film 12 is uniform. As a result of the improvement in the tolerance of lithography, a semiconductor integrated circuit device can be manufactured at a good yield.

Moreover, when the light transmittance of the half-tone film 12 in a condition of mask blanks is made to be 2% which is lower than that of the conventional half-tone film 12, it becomes possible to make a thickness of the light-shielding film 13 thinner. When the light-shielding film 13 is thinned, processing accuracy of dry etching for mask blanks is improved. When the processing accuracy of dry etching for mask blanks is improved, the half-tone type phase-shifting mask having higher accuracy can be obtained. From the fact as described above, the semiconductor integrated circuit device can be manufactured at a better yield in accordance with the first embodiment.

Second Embodiment

A second embodiment is another example of the processing steps for achieving a high transmittance described in the first embodiment. In the second embodiment, the processing steps for achieving high transmittance are conducted such that mask blanks on the way to processing are subjected to heat treatment for one hour at 450° C. in the atmospheric environment by using a mask substrate heat-treating device.

Although the atmosphere is not specifically limited, when it is the atmospheric air or an oxygen atmosphere, oxidation is promoted in the surface of the half-tone film 12 so that it is effective for elevating transmittance. Thus, a light transmittance of the half-tone film 12 in the region in which the surface is exposed increases from 2% to 4%. It is to be noted that the light transmittance of the region the surface of which is covered with the light-shielding film (for example, chromium film) 13 in the half-tone film 12 is still 2%.

As described above, a light transmittance of the half-tone film 12 can be selectively elevated also by conducting a heat treatment by using, for example, the light-shielding film 13 as the mask. In this manner, the half-tone type phase-shifting mask as described in the first embodiment can be manufactured in which the light transmittance of the half-tone film 12 included in the fine pattern region 30 and the light transmittance of the half-tone film 12 included in the light-shielding belt section are 2%, while the light transmittance of the half-tone film 12 included in the pattern region 31 which is not so fine is 4%.

Third Embodiment

A third embodiment is a further example of the processing steps for achieving high transmittance described in the first embodiment as in the second embodiment.

In the third embodiment, the processing steps for achieving a high transmittance are implemented by a plasma treatment which is carried out with the use of a dry etching device for mask in conditions of a power=200 W, a pressure=20 mT, and an oxygen flow rate=100 sccm for thirty minutes. Although oxygen gas is used in this case, effects of high transmittance due to the same surface reforming can be obtained also by using hydrogen, helium, nitrogen and the like as plasma.

In the present example, although a case where surface reforming effects are sought without etching a half-tone pattern has been mentioned, realization of high transmittance is also possible by removing a part of the surface by means of plasma etching. In this case, gases to be used for the plasma, and the plasma conditions are not specifically restricted.

As a result, a light transmittance of the half-tone film 12 in a region the surface of which is exposed increases from 2% to 4%, while a light transmittance in a region the surface of which is covered with the light-shielding film (for example, chromium film) 13 is still 2%.

As described above, a light transmittance of the half-tone film 12 can be selectively increased also by a plasma treatment in which, for example, the light-shielding film 13 is used for the mask. In this manner, the half-tone type phase-shifting mask as described in the first embodiment can be manufactured in which the light transmittance of the half-tone film 12 included in the fine pattern region 30 and the light transmittance of the half-tone film 12 included in the light-shielding belt section are 2%, while the light transmittance of the half-tone film 12 included in the pattern region 31 which is not so fine is 4%.

The present example may be conducted either in a dry etching device in succession to dry etching of the light-shielding film 13 residing in a region which is desired to be in a high transmittance, or after the resist was once removed. The present example is not restricted by the existence of the step for removing a resist.

Fourth Embodiment

A fourth embodiment is still another example of the processing steps for achieving a high transmittance described in the first embodiment as in the second and third embodiments.

In the fourth embodiment, the processing steps for achieving high transmittance are conducted through a warmed pure water rinsing treatment at 80° C. for ninety minutes in, for example, a chemical solution treating device such as a mask washing device.

As a result, a light transmittance of the half-tone film 12 in a region the surface of which is exposed increases from 2% to 5%, while a light transmittance of the half-tone film 12 in a region the surface of which is covered with the light-shielding film (for example, a chromium film) 13 is still 2%.

It is to be noted that the chemical solution treatment is not limited to pure water rinsing, but an acid treatment or an alkali treatment may be applied before the pure water rinsing treatment according to needs.

As described above, a light transmittance of the half-tone film 12 can be selectively elevated by also processing the half-tone film 12 with a chemical solution treatment by using, for example, the light-shielding film 13 for the mask. Thus, the half-tone type phase-shifting mask as described in the first embodiment can be manufactured in which the light transmittance of the half-tone film 12 included in the fine pattern region 30 and the light transmittance of the half-tone film 12 included in the light-shielding belt section are 2%, while the light transmittance of the half-tone film 12 included in the pattern region 31 which is not so fine is 5%.

Fifth Embodiment

A fifth embodiment is yet another example of the processing steps for achieving a high transmittance described in the first embodiment as in the second to fourth embodiments.

In the case where a light transmittance is desired to be remarkably changed, it is possible to apply a combination of some processing steps for achieving high transmittance described in the first to fourth embodiments.

For instance, warmed pure water rinsing at 80° C. is conducted for ninety minutes in a chemical solution treating device such as a mask washing device (fourth embodiment). In this manner, a light transmittance of the half-tone film 12 in a region the surface of which is exposed increases from 2% to 5%.

In succession to the chemical solution treatment, when any of light irradiation, substrate heating, or a plasma treatment is conducted, a light transmittance of the half-tone film 12 in a region the surface of which is exposed increases from 5% to 6%. On the other hand, a light transmittance of the half-tone film 12 in a region the surface of which is covered with the light-shielding film (for example, a chromium film) 13 is still 2%.

As described above, it is possible to apply a combination of some processing steps for achieving a high transmittance described in the first to fourth embodiments to the half-tone film 12. One of the advantages obtained in the case of the combination is that a light transmittance of the half-tone film 12 in a region the surface of which is exposed can be elevated further.

Sixth Embodiment

Figure 11:
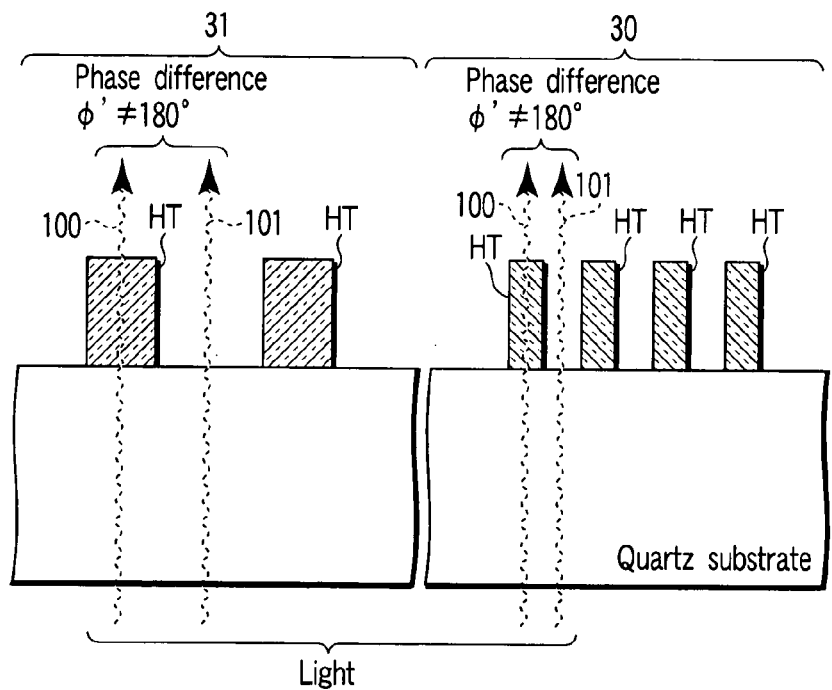
FIG. 11 is a diagram showing phase differences of light.

When the processing steps for achieving a high transmittance as described in the first to fifth embodiments are conducted, there may arise a case in which a phase difference of the light passing through the fine pattern region 30 deviates from that of the light passing through the pattern region 31 which is not fine. In case of such phase difference, for instance, when a phase difference of the light passing through the fine pattern region 30 is set to about 180 degrees, another phase difference of the light passing through the pattern region 31 which is not fine deviates from the 180 degrees. Such situation is shown in FIG. 11. As shown in FIG. 11, it is assumed in the fine pattern region 30 that a phase difference φ between a phase of a light 100 through a transparent substrate (quartz substrate) and a half-tone film (HT) and a phase of a light 101 through only the transparent substrate (quartz substrate) is set to "φ=180°". As a result, a phase difference φ' between the above-described light 100 and the above-described light 101 becomes "φ'≠180°" in the pattern region 31 which is not fine.

Of course, the same applies to the contrary case, i.e., when a phase difference of the light passing through the pattern region 31 which is not fine is set to about 180°, a phase difference of the light passing through the fine pattern 30 deviates from about 180°.

In the half-tone type phase-shifting mask in which the phase difference of light remains deviated from about 180 degrees, a focus tolerance is made small in case of an actual exposure, so that it becomes particularly unsuitable for manufacturing a semiconductor integrated circuit device having a fine pattern.

In view of the circumstances, the present embodiment provides a half-tone type phase-shifting mask which solves a problem of the above-described phase difference by forming a difference in film thickness of the transparent substrate 11.

In the case where a phase difference has deviated, an adjustment for the phase difference is made, for example, in accordance with the following procedures.

First, with respect to the processing steps for achieving a high transmittance, data indicating a relationship between changes in transmittance and changes in the phase difference has been previously acquired. A relationship between a treating time of 80° C. warmed pure water rinsing and an amount of changes in transmittance of a half-tone film is shown in FIG. 12, and a relationship between a treating time of 80° C. warmed pure water rinsing and an amount of changes in phase differences is shown in FIG. 13. Furthermore, a relationship between an amount of changes in transmittance of a half-tone film and an amount of changes in phase differences is shown in FIG. 14.

In the present example, data indicating a relationship between changes in transmittance and changes in phase difference has been previously acquired as shown in, for example, FIGS. 12 to 14, an amount of adjusting phase difference is determined based on these data, and a step for adjusting a phase difference is added in the course of the mask manufacturing step based on the amount of adjusting phase difference determined.

The step for adjusting a phase difference is classified into two cases:

The case where the phase difference becomes smaller by means of achievement of high transmittance.

The case where the phase difference becomes larger by means of achievement of high transmittance.

(The Case Where the Phase Difference Becomes Smaller by Means of Achievement of High Transmittance)

Figure 17:
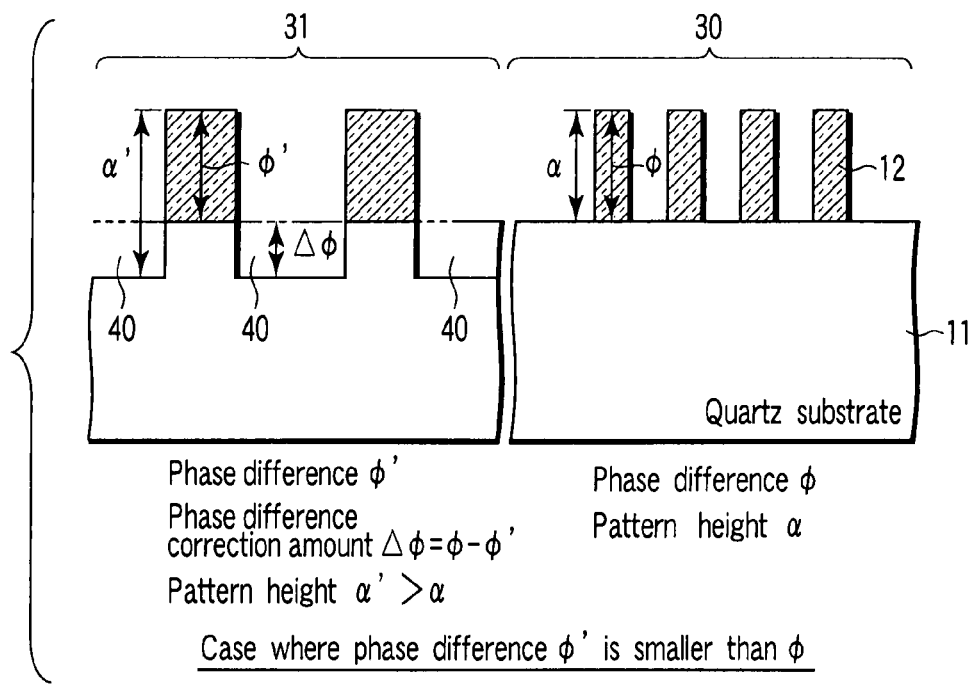
FIG. 17 is an enlarged view of FIG. 15.

As shown in FIG. 15, etching, e.g., plasma etching is applied to the transparent substrate 11 by using, for example, a light-shielding film or a half-tone film as a mask for etching after the step for forming an opening in a high transmittance region shown in FIG. 5. As a result, the transparent substrate 11 is engraved as indicated by reference numeral 40. The transparent substrate 11 residing in the pattern region 31 which is not fine is engraved, whereby phase difference is adjusted (corrected). The subsequent steps may be conducted as in the steps shown in FIG. 6 on and after. An enlarged view of FIG. 15 is shown in FIG. 17.

In the present example, it has been found that when a treatment of 80° C. pure water rinsing for sixty minutes is applied, a light transmittance of the half-tone film 12 increases by 1.8% (see FIG. 12), while the phase difference decreases by 20 degrees (see FIG. 13).

Since it has been found that the phase difference decreases by 20 degrees, the transparent substrate 11 is engraved such that a phase difference φ' (about 160 degrees in the present example) of the half-tone film 12 residing in the pattern region 31 which is not fine becomes equal to the phase difference φ (about 180 degrees in the present example) of the half-tone film 12 residing in the fine pattern region 30. By using such engraving amount, an effective pattern height of the half-tone film 12 residing in the pattern region 31 which is not fine is changed to α' so as to obtain a phase difference Δφ (about 20 degrees). In the present example, when the engraving amount is adjusted to be 20 nm, a phase difference of the half-tone film 12 residing in the pattern region 31 which is not fine becomes Δφ+Δφ'=φ, so that the phase difference before the steps for achieving a high transmittance could be recovered.

(The Case Where the Phase Difference Becomes Larger by Means of Achievement of High Transmittance)

In this case, as shown in FIG. 16, the light-shielding film in the opening of the high transmittance region shown in FIG. 6 is etched, and then, the half-tone film 12 is etched, for example, plasma-etched as indicated by reference numeral 41, whereby a thickness of the half-tone film 12 is changed. In this case, there is a possibility that the transparent substrate 11 is etched together with the half-tone film 12. However, it is possible to etch more intensively the half-tone film 12 than the transparent substrate 11 by using a difference in etching rate of both the materials. An enlarged view of FIG. 16 is shown in FIG. 18.

Figure 18:
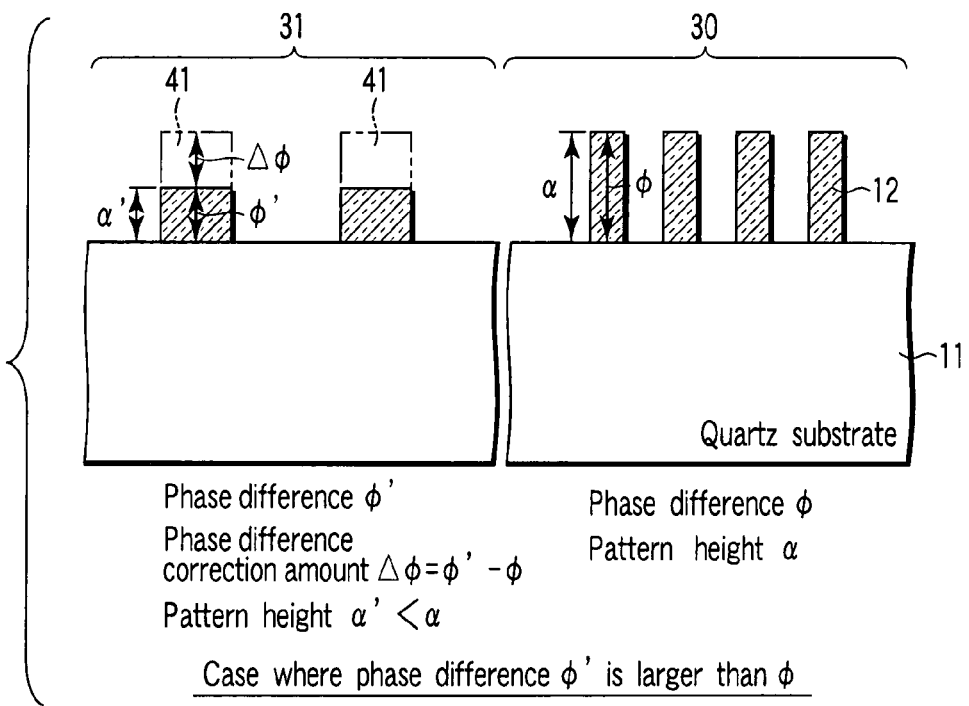
FIG. 18 is an enlarged view of FIG. 16.

As shown in FIG. 18, when it is assumed that a phase difference φ' of the half-tone film 12 residing in the pattern region 31 which is not fine is, for example, about 200 degrees, the half-tone film 12 is etched such that the phase difference φ' becomes equal to the phase difference φ (about 180 degrees in the present example) of the half-tone film 12 residing in the fine pattern region 30. By using such etching amount, an effective pattern height of the half-tone film 12 residing in the pattern region 31 which is not fine is changed to α' so as to obtain a phase difference Δφ (about 20 degrees).

As described above, a phase difference of the half-tone film 12 residing in the pattern region 31 which is not fine can be made to be Δφ+Δφ'=φ by not only engraving the transparent substrate 11, but also etching the half-tone film 12, whereby the phase difference before applying steps for achieving a high transmittance can be recovered.

Moreover, although adjustment for phase difference may be practiced in such a manner that a variation in phase difference is simply corrected, it may be practiced after optimizing the manner based on the lithography simulation results obtained by taking the three-dimensional structure of a device pattern into consideration, because a pattern height α changes due to steps for achieving a high transmittance and steps for adjusting a phase difference as shown in FIGS. 17 and 18.

In accordance with the steps as mentioned above, a half-tone type phase-shifting mask having desired different transmittances due to different pattern dimensions in which the phase difference thereof has been optimized can be manufactured.

The above-described embodiments may include the following aspects.

(1) A half-tone type phase-shifting mask provided with a light-shielding pattern and a semi-light shielding pattern, including: a transparent substrate; a half-tone film disposed on a part on which the light-shielding pattern is to be formed and a part on which the semi-light shielding pattern is to be formed in the transparent substrate; and a light-shielding film disposed on the half-tone film residing in a region on which the light-shielding pattern is formed within the half-tone film, wherein the semi-light shielding pattern contains a first semi-light shielding pattern composed of the half-tone film and a second semi-light shielding pattern composed of the half-tone film and having a smaller dimension than that of the first semi-light shielding pattern, the part on which the light-shielding pattern is formed in the half-tone film and a part of the second semi-light shielding pattern have a first light transmittance, and a part of the first semi-light shielding pattern has a second light transmittance different from the first light transmittance.

(2) The half-tone type phase-shifting mask according to the aspect (1), wherein a phase difference adjusting region which adjusts a phase difference between a phase of light passed through the transparent substrate and a phase of light passed through the transparent substrate as well as the half-tone film is in a region including the first semi-light shielding pattern.

(3) The half-tone type phase-shifting mask according to the aspect (2), wherein the phase difference adjusting region adjusts the phase difference by changing a film thickness of the transparent substrate between the region including the first semi-light shielding pattern and the region including the second semi-light shielding pattern.

(4) The half-tone type phase-shifting mask according to the aspect (2), wherein the phase difference adjusting region adjusts the phase difference by changing a film thickness of the half-tone film between the region including the first semi-light shielding pattern and the region including the second semi-light shielding pattern.

(5) The half-tone type phase-shifting mask according to any one of the aspects (2) to (4), wherein the phase difference is adjusted to about 180 degrees between the phase of the light passed through the transparent substrate and the phase of the light passed through the transparent substrate and the half-tone film.

(6) A method for manufacturing a half-tone type phase-shifting mask provided with a light-shielding pattern and a semi-light shielding pattern, comprising the steps of: preparing mask blanks provided with at least a half-tone film and a light-shielding film laminated on a transparent substrate; forming a light-shielding pattern composed of the laminate of the half-tone film and the light-shielding film, and a semi-light shielding pattern including a first semi-light shielding pattern composed of the half-tone film, and a second semi-light shielding pattern composed of the half-tone film and having a smaller dimension than that of the first semi-light shielding pattern on the mask blanks; and selectively changing a light transmittance of a part of the first semi-light shielding pattern to that of a part on which the light-shielding pattern is to be formed and a part of the second semi-light shielding pattern within the half-tone film.

(7) The manufacturing method according to the aspect (6), wherein the step of selectively changing a light transmittance of the half-tone film comprises steps of: defining a region in which the light transmittance is selectively changed; and changing the light transmittance by applying at least one of a light irradiation treatment, a substrate heating treatment, a plasma treatment, and a chemical solution treatment to the region defined.

(8) The manufacturing method according to the aspect (6) or (7), further comprising the step of forming a phase difference adjusting region which adjusts a phase difference between a phase of light passed through the transparent substrate and a phase of light passed through the transparent substrate and the half-tone film in a region including the first semi-light shielding pattern in the mask blanks.

(9) The manufacturing method according to the aspect (8), wherein the step of forming a phase difference adjusting region comprises the steps of: previously acquiring a variation in the phase difference accompanied with the step for selectively changing a light transmittance of the half-tone film; and adjusting the phase difference based on the variation acquired.

(10) The manufacturing method according to the aspect (9), wherein the adjustment of the phase difference in the phase difference adjusting step is conducted based on a simulation result obtained by taking three-dimensional structures of the transparent substrate and the half-tone film varied in accordance with the adjustment of the phase difference into consideration.

(11) The manufacturing method according to the aspect (8), wherein the phase difference adjusting region is formed by changing a film thickness of the semi-light shielding pattern between the region including the first semi-light shielding pattern and the region including the second semi-light shielding pattern.

(12) The manufacturing method according to the aspect (8), wherein the phase difference adjusting region is formed by changing a film thickness of the transparent substrate between the region including the first semi-light shielding pattern and the region including the second semi-light shielding pattern.

(13) The manufacturing method according to any one of the aspects (8) to (12), wherein the phase difference is adjusted to about 180 degrees between the phase of the light passed through the transparent substrate and the phase of the light passed through the transparent substrate and the half-tone film.

(14) A method for manufacturing a half-tone type phase-shifting mask, comprising the steps of: preparing mask blanks obtained by laminating a half-tone film, a light-shielding film, and a first resist film on a transparent substrate; drawing a device pattern including a first device pattern and a second device pattern having a smaller dimension than that of the first device pattern, and a first opening pattern defining an alignment mark on the first resist film; developing the first resist film to obtain a first resist pattern having the device pattern and the first opening pattern; using the first resist pattern as an etching mask to etch the light-shielding film and the half-tone film, thereby forming the device pattern and an alignment mark corresponding to the first opening pattern on the light-shielding film and the half-tone film; removing the first resist pattern to form a second resist film on the transparent substrate and the light-shielding film; drawing a second opening pattern corresponding to a part of the first device pattern on the second resist film while positioning with the use of the alignment mark formed on the light-shielding film as a reference; developing the second resist film to obtain a second resist pattern having the second opening pattern; using the second resist film as an etching mask to etch the light-shielding film, thereby exposing the half-tone film residing in a part of the first device pattern; removing the second resist pattern; using the light-shielding film as a mask to apply at least one of a light irradiation treatment, a substrate heating treatment, a plasma treatment, and a chemical solution treatment to the exposed part of the half-tone film, thereby selectively changing a light transmittance in the exposed part of the half-tone film; forming a third resist film on the transparent substrate, the light-shielding film, and the half-tone film; drawing a third opening pattern, corresponding to the part of the device pattern including the first and second device patterns, on the third resist film while positioning with the use of the alignment mark formed on the light-shielding film as a reference; using the third resist film as an etching mask to etch the light-shielding film, thereby exposing the half-tone film residing in the part of the device pattern; and removing the third resist pattern.

According to the embodiments of the present invention, a half-tone type phase-shifting mask the transmittance of which is changed in response to pattern dimensions, and a method for manufacturing the same can be provided.

Although the present invention has been described by some embodiments, the invention is not limited to the respective embodiments, but it may be variously modified in case of the practice thereof as long as they do not deviate from the subject matter of the invention.

For instance, although the invention has been described by using mask blanks having a half-tone film of 2% light transmittance in the embodiments, the light transmittance of the half-tone film is not restricted to 2%, and the same advantageous effects as those of the above-described embodiments can be obtained as long as the light transmittance is within the range of, for example, from 0.5% to 4%.

Furthermore, the respective embodiments may be practiced alone, or may be practiced also in a suitable combination thereof.

In addition, the respective embodiments include inventions in various steps, respectively, so that it is possible to extract the inventions in various steps by suitably combining a plurality of constituent elements disclosed in the respective embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A half-tone type phase-shifting mask provided with a light-shielding pattern and a semi-light shielding pattern, comprising:
    a transparent substrate;
    a half-tone film provided on a part on which the light-shielding pattern is to be formed and a part on which the semi-light shielding pattern is to be formed in the transparent substrate, wherein the semi-light shielding pattern includes a first semi-light shielding pattern composed of the half-tone film and a second semi-light shielding pattern composed of the half-tone film and having a smaller dimension than that of the first semi-light shielding pattern, and a part on which the light-shielding pattern is to be formed and a part of the second semi-light shielding pattern have a first light transmittance, while a part of the first semi-light shielding pattern has a second light transmittance different from the first light transmittance within the half-tone film; and
    a light-shielding film provided on the half-tone film residing in a part on which the light-shielding pattern is to be formed within the half-tone film.

2. The half-tone type phase-shifting mask according to claim 1, wherein a phase difference adjusting region which adjusts a phase difference between a phase of light passed through the transparent substrate and a phase of light passed through the transparent substrate as well as the half-tone film is in a region including the first semi-light shielding pattern.

3. The half-tone type phase-shifting mask according to claim 2, wherein the phase difference adjusting region adjusts the phase difference by changing a film thickness of the transparent substrate between the region including the first semi-light shielding pattern and the region including the second semi-light shielding pattern.

4. The half-tone type phase-shifting mask according to claim 2, wherein the phase difference adjusting region adjusts the phase difference by changing a film thickness of the half-tone film between the region including the first semi-light shielding pattern and the region including the second semi-light shielding pattern.

5. The half-tone type phase-shifting mask according to claim 2, wherein the phase difference is adjusted to about 180 degrees between the phase of the light passed through the transparent substrate and the phase of the light passed through the transparent substrate and the half-tone film.

6. The half-tone type phase-shifting mask according to claim 3, wherein the phase difference is adjusted to about 180 degrees between the phase of the light passed through the transparent substrate and the phase of the light passed through the transparent substrate and the half-tone film.

7. The half-tone type phase-shifting mask according to claim 4, wherein the phase difference is adjusted to about 180 degrees between the phase of the light passed through the transparent substrate and the phase of the light passed through the transparent substrate and the half-tone film.

8. A manufacturing method of a half-tone type phase-shifting mask provided with a light-shielding pattern and a semi-light shielding pattern, comprising:
    (A) preparing mask blank provided with at least a half-tone film and a light-shielding film laminated on a transparent substrate;
    (B) forming a light-shielding pattern composed of the laminate of the half-tone film and the light-shielding film, and a semi-light shielding pattern including a first semi-light shielding pattern composed of the half-tone film, and a second semi-light shielding pattern composed of the half-tone film and having a smaller dimension than that of the first semi-light shielding pattern; and
    (C) selectively changing a light transmittance of a part of the first semi-light shielding pattern to that of a part on which the light-shielding pattern is to be formed and a part of the second semi-light shielding pattern within the half-tone film.

9. The manufacturing method according to claim 8, wherein the (C) comprises:
    defining a region in which the light transmittance is selectively changed; and
    changing the light transmittance by applying at least one of a light irradiation treatment, a substrate heating treatment, a plasma treatment, and a chemical solution treatment to the region defined.

10. The manufacturing method according to claim 8, further comprising:
    (D) forming a phase difference adjusting region which adjusts a phase difference between a phase of light passed through the transparent substrate and a phase of light passed through the transparent substrate and the half-tone film in a region including the first semi-light shielding pattern.

11. The manufacturing method according to claim 10, wherein the (D) comprises:
    (E) previously acquiring a variation in the phase difference accompanied with the step which selectively changing a light transmittance of the half-tone film; and
    (F) adjusting the phase difference based on the variation acquired.

12. The manufacturing method according to claim 11, wherein the adjustment of the phase difference in the (F) is conducted based on a simulation result obtained by taking three-dimensional structures of the transparent substrate and the half-tone film varied in accordance with the adjustment of the phase difference into consideration.

13. The manufacturing method according to claim 10, wherein the phase difference adjusting region is formed by changing a film thickness of the transparent substrate between the region including the first semi-light shielding pattern and the region including the second semi-light shielding pattern.

14. The manufacturing method according to claim 10, wherein the phase difference adjusting region is formed by changing a film thickness of the semi-light shielding pattern between the region including the first semi-light shielding pattern and the region including the second semi-light shielding pattern.

15. The manufacturing method according to claim 8, wherein the phase difference is adjusted to about 180 degrees between the phase of the light passed through the transparent substrate and the phase of the light passed through the transparent substrate and the half-tone film.

16. The manufacturing method according to claim 10, wherein the phase difference is adjusted to about 180 degrees between the phase of the light passed through the transparent substrate and the phase of the light passed through the transparent substrate and the half-tone film.

17. A manufacturing method of a half-tone type phase-shifting mask, comprising:

preparing mask blanks obtained by laminating a half-tone film, a light-shielding film, and a first resist film on a transparent substrate;

drawing a device pattern including a first device pattern and a second device pattern having a smaller dimension than that of the first device pattern, and a first opening pattern defining an alignment mark on the first resist film;

developing the first resist film to obtain a first resist pattern having the device pattern and the first opening pattern;

using the first resist pattern as an etching mask to etch the light-shielding film and the half-tone film, thereby forming the device pattern and an alignment mark corresponding to the first opening pattern on the light-shielding film and the half-tone film;

removing the first resist pattern to form a second resist film on the transparent substrate and the light-shielding film;

drawing a second opening pattern corresponding to a part of the first device pattern on the second resist film while positioning with the use of the alignment mark formed on the light-shielding film as a reference;

developing the second resist film to obtain a second resist pattern having the second opening pattern;

using the second resist film as an etching mask to etch the light-shielding film, thereby exposing the half-tone film residing in a part of the first device pattern;

removing the second resist pattern;

using the light-shielding film as a mask to apply at least one of a light irradiation treatment, a substrate heating treatment, a plasma treatment, and a chemical solution treatment to the exposed part of the half-tone film, thereby selectively changing a light transmittance in the exposed part of the half-tone film;

forming a third resist film on the transparent substrate, the light-shielding film, and the half-tone film;

drawing a third opening pattern, corresponding to the part of the device pattern including the first and second device patterns, on the third resist film while positioning with the use of the alignment mark formed on the light-shielding film as a reference;

using the third resist film as an etching mask to etch the light-shielding film, thereby exposing the half-tone film residing in the part of the device pattern; and removing the third resist pattern.

18. A manufacturing method of a semiconductor device comprises, transcribing circuit patterns on a half-tone type phase-shifting mask to a semiconductor substrate, the half-tone type phase-shifting mask including:

a transparent substrate;

a half-tone film provided on a part on which the light-shielding pattern is to be formed and a part on which the semi-light shielding pattern is to be formed in the transparent substrate, wherein the semi-light shielding pattern includes a first semi-light shielding pattern composed of the half-tone film and a second semi-light shielding pattern composed of the half-tone film and having a smaller dimension than that of the first semi-light shielding pattern, and a part on which the light-shielding pattern is to be formed and a part of the second semi-light shielding pattern have a first light transmittance, while a part of the first semi-light shielding pattern has a second light transmittance different from the first light transmittance within the half-tone film; and a light-shielding film provided on the half-tone film residing in a part on which the light-shielding pattern is to be formed within the half-tone film.

19. The manufacturing method according to claim 18, wherein a light transmittance of the half-tone film being provided in a region including the first semi-light shielding pattern is made to be selectively higher than that of the half-tone film being provided in a region including the second semi-light shielding pattern.

* * * * *

UNITED STATES PATENT AND TRADEMARK OFFICE
CERTIFICATE OF CORRECTION

PATENT NO. : 7,759,025 B2 Page 1 of 1
APPLICATION NO. : 11/783036
DATED : July 20, 2010
INVENTOR(S) : Murano It is certified that error appears in the above-identified patent and that said Letters Patent is hereby corrected as shown below:

Claim 8, column 16, line 22, change "blank" to --blanks--.

Claim 11, column 16, line 58, change "changing" to --changes--.

Claim 18, column 18, line 20, change "comprises," to --comprises:--.

Signed and Sealed this

Second Day of November, 2010

David J. Kappos
*Director of the United States Patent and Trademark Office*